United States Patent
Kenny et al.

(10) Patent No.: US 6,389,326 B2
(45) Date of Patent: *May 14, 2002

(54) DIFFERENTIAL PROCESS CONTROL METHOD

(75) Inventors: Danny Kenny; Keith Lindberg, both of Sherman, TX (US)

(73) Assignee: GlobiTech Incorporated, Sherman, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,031

(22) Filed: Aug. 20, 1998

Related U.S. Application Data

(60) Provisional application No. 60/056,654, filed on Aug. 22, 1997.

(51) Int. Cl.$^7$ ................................................. G06F 7/00
(52) U.S. Cl. ........................ 700/218; 700/112; 700/113; 700/114; 700/228; 700/229
(58) Field of Search ...................... 700/218, 56, 228, 700/229, 230, 112, 113, 114; 318/640; 901/47; 414/935

(56) References Cited

U.S. PATENT DOCUMENTS

| | | | | |
|---|---|---|---|---|
| 5,563,798 A | * | 10/1996 | Berken et al. | 364/478.06 |
| 5,611,655 A | * | 3/1997 | Fukasawa et al. | 414/217 |
| 5,740,062 A | * | 4/1998 | Berken et al. | 364/478.06 |
| 5,777,327 A | * | 7/1998 | Mizuno | 250/310 |
| 5,970,818 A | * | 10/1999 | Kikuchi et al. | 74/526 |
| 6,047,083 A | * | 4/2000 | Mizuno | 382/141 |

* cited by examiner

*Primary Examiner*—Robert Beausoleil
*Assistant Examiner*—Tim Vo
(74) *Attorney, Agent, or Firm*—Jones, Day, Reavis & Pogue

(57) ABSTRACT

A system and method for monitoring a process flow of a semiconductor wafer. In one embodiment, the method initially calculates a first location of the wafer before it is processed. The wafer is then moved into a process chamber where it is processed. Then a second location of the wafer is calculated before the wafer is unloaded. If the difference between the first and second locations are within a predetermined amount, the wafer is unloaded and regular processing steps proceed. If the difference is not within the predetermined amount, an alarm is activated and the process is stopped.

3 Claims, 1 Drawing Sheet

DIFFERENTIAL PROCESS CONTROL METHOD

CROSS REFERENCE TO RELATED APPLICATIONS

This application claims priority from U.S. Provisional Patent Application Ser. No. 60/056,654, filed Aug. 22, 1997.

TECHNICAL FIELD

This invention relates generally to semiconductor processing and, more particularly, to a system and method for monitoring a wafer's location during processing.

BACKGROUND OF THE INVENTION

In general, integrated circuit technology is based on the ability to form numerous transistor structures on a single semiconductor substrate. Typically, multiple integrated circuits will be formed on a single silicon wafer, the wafer providing the semiconductor substrate for the circuits. To increase the purity and hence the quality and reliability of the substrate, the wafer may be pre-processed to form an ultra-pure epitaxially grown ("epi") layer on top of the wafer. Such preprocessing is typically performed by the following steps:
1. an unprocessed wafer is loaded onto a loadlock;
2. the wafer is then transferred from the loadlock to a center-find device;
3. the wafer is then transferred from theter-find device to a process chamber;
4. the wafer is then transferred back to the load lock.

In each case, a robot arm is used to move the wafer from one chamber to another, as well as to position the wafer inside the process chamber. As a result, substantial savings in cleanliness, time, and labor expense are achieved. However, inaccuracies sometimes occur when using a robot arm which can degrade the wafer and cause substantial yield loss. For example, the wafer is moved on the robot arm under an optical assembly, or center finder. The center finder finds a geometric center of the wafer. The location of the geometric center of the wafer can then be used by the robot arm to assure that the geometric center of the wafer is placed in the desired location in the process chamber.

This is accomplished by the following method. First, the location, which is represented as an offset between the actual center of the wafer and the nominal center, that is where the center of the wafer should be. Next, the offset is scaled to provide an offset value to the robot arm so that it can place the center of the wafer in a desired location in the process chamber.

However, several problems often resulted from the above describe method. For one, the wafer may move on the robot arm or while it is being loaded into the process chamber, thereby making the offset value incorrect. For another, the wafer may move inside the process chamber while it is being processed. Finally, the wafer may move during or after it has been unloaded from the process chamber. Each of these problems are especially troublesome because the only way of detecting the problem is by a resulting process degradation, yield loss, or in severe situations, machine failures. In the case of process degradation and yield loss, these are often detected only after many wafers have been incorrectly processed.

SUMMARY OF THE INVENTION

The foregoing problems are solved and a technical advance is achieved by a system and method for monitoring a process flow of a semiconductor wafer. In one embodiment, the method calculates a first offset value of the wafer before it is processed. The wafer is then moved into a process chamber where it is processed. Then a second offset value of the wafer is calculated before the wafer is unloaded. If the difference between the first and second offset values are within a predetermined amount, the wafer is unloaded and regular processing continues. If the difference is not within the predetermined amount, an alarm is activated and the process is stopped.

An advantage of the present invention is that it provides an early indication of process degradation or yield loss. Such early indication would result in higher product quality and higher process yields.

Another advantage of the present invention is that it can prevent any loss or damage that may occur when the wafer is being unloaded.

DESCRIPTION OF THE PREFERRED EMBODIMENT

Figure 1:
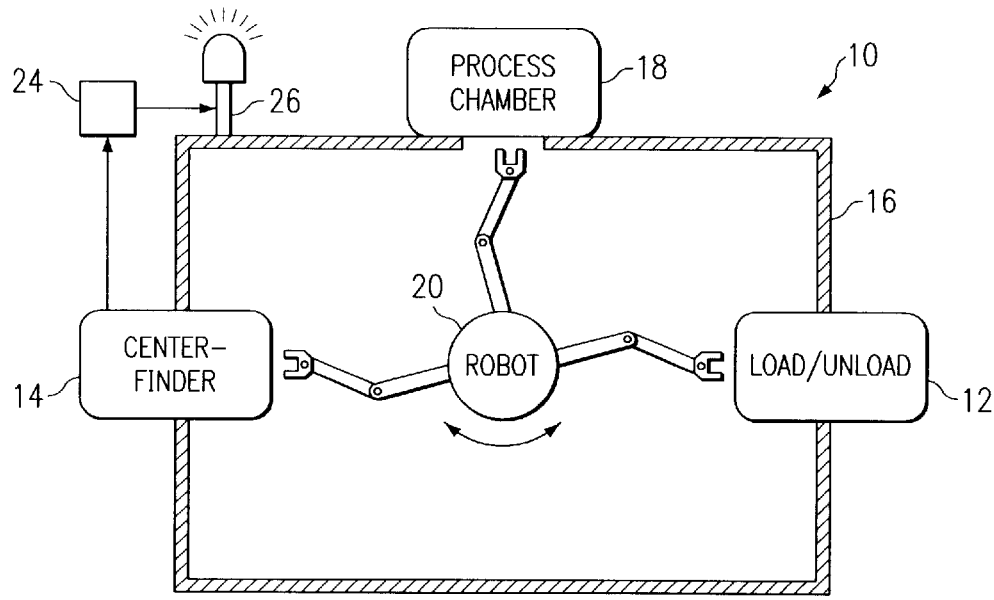
FIG. 1 illustrates an exemplary semiconductor wafer epi processing facility.

Referring to the FIG. 1, the reference numeral 10 designates a wafer epi processing facility including a loadlock chamber 12, a center-finder device 14, a transfer chamber 16, and a process chamber 18. The facility 10 provides an ultra-clean environment by having a robot 20 located in the middle of the transfer chamber 16 for moving a wafer (not shown) between the loadlock chamber 12, the center-finder 14, and the process chamber 18.

The center-finder 14 includes conventional software and circuitry for finding the center of the wafer and calculating an offset value for the robot 20. With the offset value, the robot 20 can attempt to place the wafer in a desired location in the process chamber 16 and the loadlock chamber 12. The center-finder 14 includes additional circuitry and/or software, represented by a control device 24, for storing the offset value and comparing the offset value for a later-retrieved offset value. In addition, the control device 24 can control an alarm 26, as described in greater detail, below.

Figure 2:
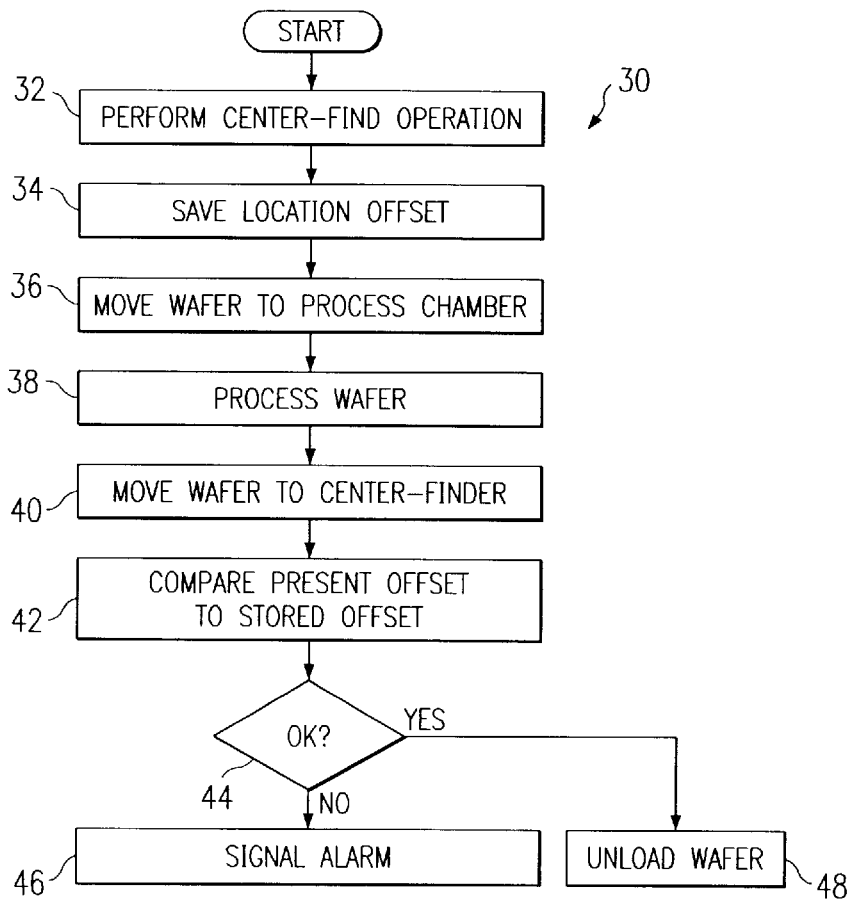
FIG. 2 illustrates a process control routine to be used by the processing facility of FIG. 1.

Referring also to FIG. 2, in operation, the epi processing facility 10 utilizes a process control routine 30 in addition to conventional processing steps. It is understood that the conventional processing steps are well known in the art and therefore, for the sake of clarity, will not be further discussed.

At step 32, the wafer is at the center-finder 14 and a first center-find operation is performed and a first offset value is determined. At step 34, the first offset value is stored in the control device 24. At step 36, the wafer is moved to the process chamber 16 and at step 38, conventional processing is performed on the wafer. At step 40, the wafer is then moved back to the center-finder 14 and a second center-find operation is performed on the wafer and a second offset value is determined. At step 42, the control device 24 compares the first offset value to the second offset value. At step 44, the control device 24 determines the difference between the two offset values. If the difference is greater than a predetermined amount, execution proceeds to step 46 and the alarm 26 is activated. If the difference is less than the predetermined amount, execution proceeds to step 48 where the wafer is moved to the loadlock chamber 12 and unloaded.

Although illustrative embodiments of the invention have been shown and described, other modifications, changes, and substitutions are intended in the foregoing disclosure.

For example, the control device 24 may simply be additional programming in the center-finder 14. Accordingly, it is appropriate that the appended claims be construed broadly and in a manner consistent with the scope of the invention.

What is claimed is:

1. A method for monitoring a process flow of a semiconductor wafer, the method comprising the steps of:

calculating a first offset value indicative of the location offset between the nominal location of the wafer and the actual location of the wafer before processing;

moving the wafer into a process chamber for processing;

processing the wafer;

calculating a second offset value indicative of the location offset between the nominal location of the wafer and the actual location of the wafer after processing;

comparing said first offset value with said second offset value;

determining if a difference between the first and second offset values is greater than a predetermined amount; and activating an alarm if the difference is greater than the predetermined amount.

2. The method of claim 1 wherein the steps of calculating first and second offset values comprise the steps of calculating the first offset values between the actual center of the wafer and the nominal center of the wafer.

3. The method of claim 1 and further comprising the step of storing the first offset value after calculation said first offset value and before the comparing step.

* * * * *

UNITED STATES PATENT AND TRADEMARK OFFICE
CERTIFICATE OF CORRECTION

PATENT NO.    : 6,389,326 B2
DATED         : May 14, 2002
INVENTOR(S)   : Danny Kenny and Keith Lindberg It is certified that error appears in the above-identified patent and that said Letters Patent is hereby corrected as shown below:

Column 1,
Line 28, "theter-find" should read -- the center-find --.
Line 30, "load lock" should read -- loadlock --.

Signed and Sealed this

Twenty-third Day of July, 2002

Attest:

JAMES E. ROGAN
Director of the United States Patent and Trademark Office

Attesting Officer